United States Patent [19]

Kitane et al.

[11] 4,391,658

[45] Jul. 5, 1983

[54] METHOD FOR MANUFACTURING SEMICONDUCTOR SUBSTRATE

[75] Inventors: Syoiti Kitane; Shigeru Honjo, both of Himeji; Kuniyoshi Ohe; Fumio Tobioka, both of Hyogo, all of Japan

[73] Assignee: Tokyo Shibaura Denki Kabushiki Kaisha, Japan

[21] Appl. No.: 329,060

[22] Filed: Dec. 9, 1981

[30] Foreign Application Priority Data

Dec. 12, 1980 [JP] Japan .................... 55-175305

[51] Int. Cl.³ .......................... H01L 21/225
[52] U.S. Cl. ........................ 148/188; 148/187
[58] Field of Search ................ 148/188, 187, 189

[56] References Cited

U.S. PATENT DOCUMENTS

| | | | |
|---|---|---|---|
| 2,974,073 | 3/1961 | Armstrong | 148/188 |
| 3,507,714 | 4/1970 | New et al. | 148/186 |
| 3,775,197 | 11/1973 | Sahagun | 148/188 |
| 3,914,138 | 10/1975 | Rai-Choudhury | 148/187 X |
| 3,956,036 | 5/1976 | Molee | 148/188 |
| 3,963,523 | 6/1976 | Tanaka et al. | 148/188 X |
| 4,105,476 | 8/1978 | Hamzawi | 148/187 |
| 4,233,093 | 11/1980 | Chow | 148/189 |
| 4,249,968 | 2/1981 | Gardiner et al. | 148/188 X |
| 4,279,671 | 7/1981 | Komatsu | 148/188 |

FOREIGN PATENT DOCUMENTS 50-106573 8/1975 Japan .
51-23073 2/1976 Japan .
52-48052 12/1977 Japan .

Primary Examiner—G. Ozaki
Attorney, Agent, or Firm—Finnegan, Henderson, Farabow, Garrett & Dunner

[57] ABSTRACT

A method for manufacturing a semiconductor substrate comprising the steps of forming on all surfaces of a raw semiconductor substrate an impurity layer of the same conductivity type as the raw semiconductor substrate and forming a first insulating film on the entire impurity layer, removing those portions of the impurity layer and first insulating film which are formed on one major surface of the raw semiconductor substrate and finishing the exposed major surface of the raw semiconductor substrate, thus providing a mirror surface, forming a second insulating film on the mirror surface of the raw semiconductor substrate and on the remaining first insulating film, forming a protective film on the entire second insulating film and forming a third insulating film on the entire protective film, thus providing a laminate, holding the laminate side by side together with other laminates provided in the same way, heating the laminates thus held, in an oxidizing atmosphere, thereby diffusing the impurity from the impurity layers into the raw semiconductor substrates to form diffusion layers in the raw semiconductor substrates, and removing the first insulating film, second insulating film, protective film and third insulating film from each of the laminates. According to the invention, a high precision and high quality product semiconductor substrate can be inexpensively provided.

5 Claims, 7 Drawing Figures

METHOD FOR MANUFACTURING SEMICONDUCTOR SUBSTRATE

BACKGROUND OF THE INVENTION

This invention relates to a method for manufacturing a semiconductor substrate used for the manufacture of semiconductor devices, more particularly power transistors.

Recent demands for the semiconductor products are improved performance and reduced cost.

Hitherto, the semiconductor substrate that is used for a power transistor has been a commonly termed one side lap wafer or OSL water. The OSL wafer is either of NonN+-type or PonP+-type depending upon the type of doped impurity. To manufacture such semiconductor substrates, two methods are alternatively employed. In one of the methods impurities are diffused into a thick raw semiconductor substrate from both major surfaces at the same time, thus forming deep diffusion layers. Then, the diffusion layer on one major surface is removed by lapping or polishing, followed by mirror surface finishing to obtain the substrate product. In the other method, a raw semiconductor substrate slightly thicker than the product substrate is subjected to a step of forming on both major surfaces high impurity concentration layers of 20 $\mu$m thick and having the same conductivity type as the substrate. Then the high impurity concentration layer on one surface is removed, and an insulating film is formed to cover the entire surfaces. Subsequently, the substrate is subjected to a high temperature heat treatment to form a deep diffusion layer only in one surface, thus completing the product.

However, the substrate manufacture methods mentioned above have the following drawbacks.

(1) In the first-mentioned method, in which the diffusion is done from both major surfaces, a thick substrate has to be used as the starting material, and the cost is high.

(2) A long time is required for step of removal on one major surface and also for the mirror surface finish.

(3) The operating process is cumbersome.

(4) In the second-mentioned method, in which the diffusion is done from only one major surface, at the time of the polishing step and also for chemical ethcing for the removal of the impurity layer on one major surface, an inclined edge surface of the substrate is liable to result, thus impairing the parallelness.

(5) Since the protection by insulating film lamination is provided only as one layer or layers of the same character, at the time of the diffusion in one major surface an abnormal diffusion layer is liable to result due to intrusion of high concentration impurity into the other surface.

As a measure for solving the above problems, it may be thought to use a vapor growth wafer. Again in this case, the substrate as the starting material is expensive, and this cannot be an absolute measure.

SUMMARY OF THE INVENTION

An object of the invention is to provide a method for manufacturing a semiconductor substrate, with which an inexpensive starting material can be used, the manufacturing process is simple, and a high precision and high quality semiconductor substrate product can be obtained.

According to the invention, there is provided a method for manufacturing a semiconductor substrate comprising the steps of:

forming on all surfaces of a raw semiconductor substrate an impurity layer of the same conductivity type as the raw semiconductor substrate and forming a first insulating film on the entire impurity layer;

removing those portions of the impurity layer and first insulating film which are formed on one major surface of the raw semiconductor substrate and finishing the exposed major surface of the raw semiconductor substrate, thus providing a mirror surface;

forming a second insulating film on the mirror surface of the raw semiconductor substrate and on the remaining first insulating film, forming a protective film on the entire second insulating film and forming a third insulating film on the entire protective film, thus providing a laminate;

holding the laminate side by side together with other laminates provided in the same way;

heating the laminates thus held, in an oxidizing atmosphere, thereby diffusing the impurity from the impurity layers into the raw semiconductor substrates to form diffusion layers in the raw semiconductor substrates; and removing the first insulating film, second insulating film, protective film and third insulating film from each of the laminates.

DETAILED DESCRIPTION OF THE PREFERRED EMBODIMENTS

Figure 1A:
FIGS. 1A to 1F are views showing consecutive steps of a method of manufacture according to the invention.
Figure 1B:
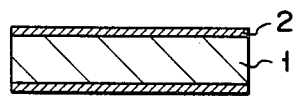
Figure 1C:
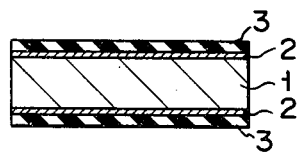
Figure 1D:
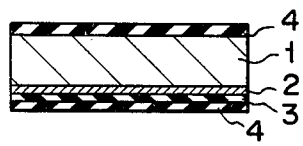
Figure 1E:
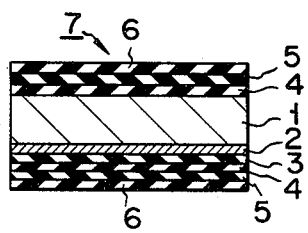
Figure 1F:
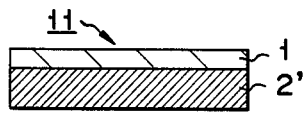
Figure 2:
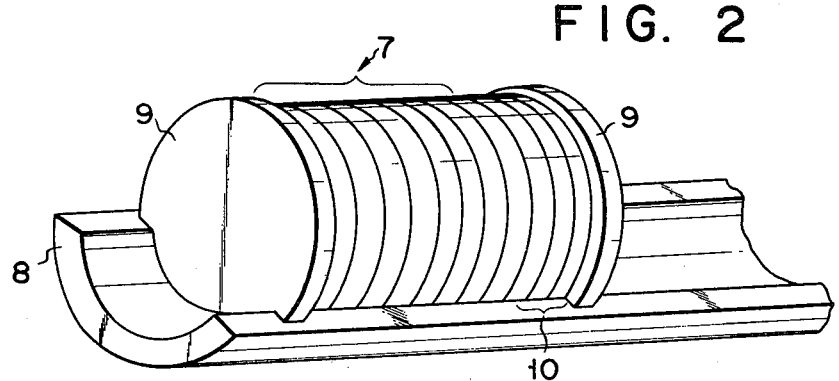
FIG. 2 is a perspective view showing a diffusion boat used for the method according to the invention.

Now, an embodiment of the invention applied to a semiconductor substrate for an NPN power transistor will be described. An N-type semiconductor silicon substrate 1 with a thickness of 300 $\mu$m and having both major surfaces finished to the order of #1000 laps is first prepared as shown in (A) in FIG. 1. The substrate is then washed in a predetermined manner. Subsequently, a deposition layer 2 having a thickness of about 20 $\mu$m is formed on the both major surfaces of the substrate 1 as shown in (B) in FIG. 1. The deposition layer 2 is of the same conductivity type as the substrate 1 and has a high impurity concentration. It is formed in a process carried out at a temperature of 1,200° C. for 2 to 3 hours using, for instance, phosphorus oxychloride. Thereafter, the substrate is held in a steam atmosphere at a temperature of 1,000° to 1,100° C. for 2 to 3 hours to form a first insulating film 3 made of silicon dioxide as shown in (C) in FIG. 1. Afterwards, one major surface of the substrate is covered with a protective coating of wax or the like. Then, the first insulating film 3 on the other surface is removed by immersion in dilute hydrogen fluoride solution, and then the surface is ground to a depth of about 30 (covering the thickness of 20 $\mu$m of the deposition layer 2 and surface region of the substrate 1 with a thickness of about 10 $\mu$m) by the cassette type grinder lap method. The surface is then finished to obtain a mirror surface such that an object can be clearly reflected althrough grinding traces are present. The cassette type grinder lap method comprises the steps of arranging in a vertical direction within the cassette a plurality of substrates each having the first insulation film 3 removed from one surface by the above-described treatment with a dilute hydrogen fluoride solution; disposing by using transfer means the substrates within the cassette on a stage provided with a large number of suction holes; fixing the substrates on the stage by vacuum suction from below through the suction holes; polishing the upper surfaces of the fixed substrates by a grinder; and arranging the polished substrates in a vertical direction within another cassette by using transfer means. Thereafter, broken layers and damages are removed by etching the ground surface to an extent of about 1.0 μm using an acid mixture solution containing hydrogen fluoride, nitric acid and acetic acid ($HF+HNO_3+CH_3COOH$). By this removal of the broken layers the surface is sufficiently finished as the mirror surface finish, but the grinding traces are not completely removed. However, the remaining grinding traces do not rise give to any problem in the subsequent process of manufacturing a transistor. Also, they do not cause any problem in the characteristic and reliability of the completed transistor element.

The processed substrate is then held in a steam atmosphere at a temperature of 1,000° to 1,100° C. for about 4 to 6 hours to cause growth of a second insulating film 4 of silicon dioxide to a thickness of about 1.2 μm (as shown in (D) in FIG. 1).

Then, a protective film 5 of polysilicon is formed on the both major surfaces of the substrate to a thickness of 0.4 to 0.8 μm through pyrolytic reaction of monosilane ($SiH_4$) by the reduced pressure-CVD method, and a silicon nitride film is formed as a third insulating film 6 to a thickness of 0.1 to 0.15 μm on the protective film 5 through the pyrolitic reaction of dichlorosilane ($SiH_2Cl_2$) or monosilane ($SiH_4$) and ammonia ($NH_3$) by the reduced pressure-CDV method, as shown in (E) in FIG. 1. A plurality of laminates 7 that are obtained in the manner as described above are arranged side by side such that their sides of the deposition layer 2 are in close contact. These laminates 7 are supported in a sidewise pressed state in a boat 8, which is made of a heat-resistant silicon or silicon carbide material and a semi-circular sectional profile. They are sandwiched between heat-resistant partition plates 9 having a greater diameter than the diameter of them together with auxiliary plates 10 of the same material as the partition plates 9 but having the same size as them which are provided for filling any space. Thereafter, the laminates arranged in this way are subjected to a heat treatment in an atmosphere with a gas mixture atmosphere with a mixture ratio of $O_2/(N_2+O_2)<0.1$ at a high temperature of 1,270° C. or above for 200 hours or longer, thereby causing diffusion of the impurity in the deposition layer 2 into the substrate 1. Thereafter, the laminates are immersed in a mixed liquid composed of a surface active agent, acetic acid and hydrogen fluoride. As a result, the laminates in close contact with one another, having undergone the heat treatment mentioned above, are separated into individual laminates while at the same time the first, second and third insulating films and protective film are removed. Thus, a product semiconductor substrate 11 consisting of the substrate 1 and diffusion layer 2' and having a thickness of 250μ as shown in (F) in FIG. 1 is obtained. In the principal surface of the semiconductor substrate 11 which is completed in this way, a base and emitter are formed by a well known method, and then necessary electrodes are formed, whereby forming a desired transistor element.

It is to be appreciated that with the method for manufacture of a semiconductor substrate according to the invention the thickness (300 μm) of the semiconductor substrate 1 as the starting material may be about 1.2 times the thickness (250 μm) of the semiconductor substrate 11 as the product, which is less by about 40% compared to the prior art method for manufacture of a semiconductor substrate, so that it is possible to drastically reduce the processing period required for the mirror surface finish of one major surface of the substrate. Further, the polishing process is simplified by the above-mentioned cassette type grinder lap method, and it is possible to dispense with wax or the like for securing the substrate. Thus, the subsequent treatment becomes readier. Further, the produced semiconductor substrate 11 has accurately parallel upper and lower surfaces. Also, in the step of impurity diffusion into one surface of the substrate, the protective film 5 and the third insulating film 6 serve to prevent the impurity from being diffused from the outside into the other surface of the substrate.

While the above embodiment has concerned with a semiconductor substrate used for an NPN transistor, it is of course possible to apply the invention to the semiconductor substrate for a PNP power transistor as well.

As has been described in the foregoing, with the method for manufacture of a semiconductor substrate according to the invention, it is possible to readily manufacture a high precision, high quality semiconductor substrate product with a thin and inexpensive raw substrate used as a starting material.

What we claim is:

1. A method for manufacturing a semiconductor substrate comprising the steps of:
   forming on all surfaces of a raw semiconductor substrate an impurity layer of the same conductivity type as the raw semiconductor substrate and forming a first insulating film on the entire impurity layer;
   removing those portions of the impurity layer and first insulating film which are formed on one major surface of the raw semiconductor substrate and finishing the exposed major surface of the raw semiconductor substrate, thus providing a mirror surface;
   forming a second insulating film on the mirror surface of the raw semiconductor substrate and on the remaining first insulating film, forming a protective film on the entire second insulating film and forming a third insulating film on the entire protective film, thus providing a laminate;
   holding the laminate side by side together with other laminates provided in the same way;
   heating the laminates thus held, in an oxidizing atmosphere, thereby diffusing the impurity from the impurity layers into the raw semiconductor substrates to form diffusion layers in the raw semiconductor substrates; and
   removing the first insulating film, second insulating film, protective film and third insulating film from each of the laminates.

2. The method of claim 1, wherein said first and second insulating films consist of silicon oxide, said protective film consists of polycrystalline silicon, and said third insulating film consists of silicon nitride.

3. The method of claim 2, wherein said step of removing said first, second and third insulating films and protective film from said thermally treated laminate is carried out by immersing said laminate in a mixed liquid consisting of a surface active agent, acetic acid and hydrogen fluoride.

4. The method of claim 1, wherein the removal of the impurity layer on one major surface of the semiconductor substrate and mirror surface finish of the exposed substrate surface are carried out by polishing.

5. The method of claim 1 or 2, wherein the formation of said first and second insulating films is carried out by thermal oxidation.

* * * * *